(12) United States Patent
Oeda et al.

(10) Patent No.: US 7,203,215 B2
(45) Date of Patent: Apr. 10, 2007

(54) SEMICONDUCTOR LASER DEVICE, SEMICONDUCTOR LASER MODULE, AND OPTICAL FIBER AMPLIFIER

(75) Inventors: Yasuo Oeda, Sodegaura (JP); Kiyofumi Muro, Chiba (JP); Michio Okubo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 192 days.

(21) Appl. No.: 11/020,320

(22) Filed: Dec. 27, 2004

(65) Prior Publication Data

US 2005/0105845 A1 May 19, 2005

Related U.S. Application Data

(63) Continuation of application No. PCT/JP03/08236, filed on Jun. 27, 2003.

(30) Foreign Application Priority Data

Jun. 27, 2002 (JP) .............................. 2002-188500

(51) Int. Cl.
*H01S 5/00* (2006.01)
(52) U.S. Cl. .............................. 372/45.01; 372/43.01; 372/49.01
(58) Field of Classification Search ......... 372/1–46.01, 372/49.01
See application file for complete search history.

(56) References Cited

U.S. PATENT DOCUMENTS

| | | | |
|---|---|---|---|
| 5,022,036 A * | 6/1991 | Suyama et al. | 372/45.01 |
| 5,812,578 A * | 9/1998 | Schemmann et al. | 372/43.01 |
| 5,815,521 A * | 9/1998 | Hobson et al. | 372/45.01 |
| 6,171,878 B1 * | 1/2001 | Fujimoto et al. | 438/46 |
| 6,954,477 B2 * | 10/2005 | Uchida et al. | 372/43.01 |
| 7,065,118 B2 * | 6/2006 | Tojo et al. | 372/49.01 |
| 2002/0039374 A1 * | 4/2002 | Onomura et al. | 372/46 |
| 2002/0141469 A1 * | 10/2002 | Yamasaki et al. | 372/46 |
| 2004/0105473 A1 * | 6/2004 | Tojo et al. | 372/45 |
| 2005/0135447 A1 * | 6/2005 | Takatani | 372/45 |

FOREIGN PATENT DOCUMENTS

| | | |
|---|---|---|
| JP | 9-5546 | 1/1997 |
| JP | 2001-185805 | 7/2001 |

OTHER PUBLICATIONS

Akihiko Kasukawa, et al., "Recent Progress of High Power Semiconductor Lasers for EDFA Pumping"; The Furukawa Electric Co., Ltd., Furukawa Review, Apr. 19, 2000, pp. 23-28. (with Japanese version, pp. 44-49).

* cited by examiner

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

A semiconductor laser device includes a layer structure of a first conductive cladding layer, an active layer, and a second conductive cladding layer sequentially grown on a first conductive semiconductor substrate; and a light emitting facet from which a laser beam having a first wavelength is emitted. Refractive indexes of the first and the second conductive cladding layers with respect to the first wavelength are lower than an effective refractive index with respect to the first wavelength. With respect to a light having a second wavelength incident on the light emitting facet from outside, the refractive index of at least one of the first and the second conductive cladding layers is equal to or higher than the effective refractive index with respect to the second wavelength.

32 Claims, 11 Drawing Sheets

SEMICONDUCTOR LASER DEVICE, SEMICONDUCTOR LASER MODULE, AND OPTICAL FIBER AMPLIFIER

CROSS-REFERENCE TO RELATED APPLICATIONS

This application is a continuation of PCT/JP03/08236 filed on Jun. 27, 2003, the entire content of which are incorporated herein by reference.

BACKGROUND OF THE INVENTION

1) Field of the Invention

The present invention relates to a semiconductor laser device, a semiconductor laser module, and an optical fiber amplifier that do not confine an incident light from outside and having a different wavelength from a wavelength of a laser beam emitted.

2) Description of the Related Art

Conventionally, information is transmitted through the Internet or the like, by optical fiber communications. In the optical fiber communications, information is transmitted by transmitting optical signals through optical fibers. Various designs have been proposed to enable long distance transmission of optical signals, but it is currently impossible to reduce losses in light intensity accompanying the long distance transmission to zero, and hence, optical signals attenuate at a certain rate. Therefore, an optical fiber amplifier for amplifying the attenuated optical signals becomes necessary.

FIG. 12A is a diagram of the structure of the optical fiber amplifier of a backward pumping type, of the optical fiber amplifiers according to the related art. An optical signal emitted from a signal light source 101 is transmitted though the optical fiber, and enters into an amplifying optical fiber 104. Pump light emitted from a pump light source 102, on the other hand, is transmitted though a pump light-transmitting optical fiber 105, passes through a coupler 103, and enters into the amplifying optical fiber 104. In an optical fiber amplifier using erbium doped fiber amplifier (EDFA), erbium ions are added to the amplifying optical fiber 104, and since the pump light enters into the amplifying optical fiber 104, the erbium ions are pumped to a high energy state.

When a signal light enters into the amplifying optical fiber 104 in the pumped state, light having the same wavelength and the same phase as those of the signal light is stimulated and emitted. Therefore, the intensity of the signal light is amplified as compared with that of the signal light before entering into the amplifying optical fiber 104, and the signal light is transmitted through the optical fiber as an amplified signal light.

The conventional optical fiber amplifier, however, has a problem in that the signal light includes certain noises due to the presence of the pump light source 102. The coupler 103 optically couples the optical fiber for transmitting the signal light and the pump light-transmitting optical fiber 105. As shown in FIG. 12B, therefore, not only the pump light is transmitted to the optical fiber, but also a part of the signal light indicated by an arrow with a dotted line in FIG. 12B is separated by the coupler 103, transmitted through the pump light-transmitting optical fiber 105, to enter into the pump light source 102.

On the other hand, the semiconductor laser device forming the pump light source 102 includes a resonator structure for effecting laser oscillation. Specifically, in the semiconductor laser device forming the pump light source 102, a high reflection coating is provided on a facet opposite to a laser beam emitting facet. Therefore, a part of the signal light separated by the coupler 103 and entering into the semiconductor laser device is reflected by the high reflection coating and emitted from the pump light source, is transmitted through the pump light-transmitting optical fiber 105, and is coupled again with the signal light amplified by the coupler 103. There is a path difference between the signal light amplified by the amplifying optical fiber 104 and the part of the signal light entering into the pump light source, by the pump light-transmitting optical fiber 105 and the length of the resonator of the pump light source 102. Therefore, the signal light output from the coupler 103 inevitably includes noises due to the part of the signal light having a predetermined phase difference with respect to the amplified signal light. Due to the presence of noises, a signal read error occurs on the receiving side of the signal light, thereby making it difficult to transmit information accurately.

In a conventional optical fiber amplifier, occurrence of such noises is an inevitable problem, as long as the optical fiber amplifier has the pump light source 102. Since the noises have the same wavelength as that of the signal light, the noises cannot be removed by a conventional filtering apparatus, which removes noises by excluding light having a wavelength different from that of the signal light.

SUMMARY OF THE INVENTION

It is an object of the present invention to solve at least the above problems in the conventional technology.

A semiconductor laser device according to one aspect of the present invention includes a layer structure of a first conductive cladding layer, an active layer, and a second conductive cladding layer sequentially grown on a first conductive semiconductor substrate; and a light emitting facet from which a laser beam having a first wavelength is emitted. Refractive indexes of the first conductive cladding layer and the second conductive cladding layer with respect to the first wavelength are lower than an effective refractive index with respect to the first wavelength. With respect to a light having a second wavelength incident on the light emitting facet from outside, the refractive index of at least one of the first conductive cladding layer and the second conductive cladding layer is equal to or higher than the effective refractive index with respect to the second wavelength.

A semiconductor laser device according to another aspect of the present invention includes a layer structure of a first conductive cladding layer, an active layer, and a second conductive cladding layer sequentially grown on a first conductive semiconductor substrate; and a light emitting facet from which a laser beam having a first wavelength is emitted. Refractive indexes of the first conductive cladding layer and the second conductive cladding layer with respect to the first wavelength are lower than an effective refractive index with respect to the first wavelength. With respect to a light having a second wavelength incident on the light emitting facet from outside, the effective refractive index is equal to or lower than 1.003 times of the refractive index of at least one of the first conductive cladding layer and the second conductive cladding layer.

A semiconductor laser module according to still another aspect of the present invention includes the above semiconductor laser device according to the present invention; an optical fiber that guides the laser beam emitted from the semiconductor laser device to outside; and an optical coupling lens system that optically couples the semiconductor laser device and the optical fiber.

An optical fiber amplifier according to still another aspect of the present invention includes a pump light source that includes either of the above semiconductor laser device according to the present invention and the above semiconductor laser module according to the present invention;

an optical fiber that transmits a signal light having the second wavelength;

an amplifying optical fiber connected to the optical fiber; and a coupler that allows the pump light having the first wavelength emitted from the pump light source to enter into the amplifying optical fiber.

The other objects, features, and advantages of the present invention are specifically set forth in or will become apparent from the following detailed description of the invention when read in conjunction with the accompanying drawings.

DETAILED DESCRIPTION

Figure 1:
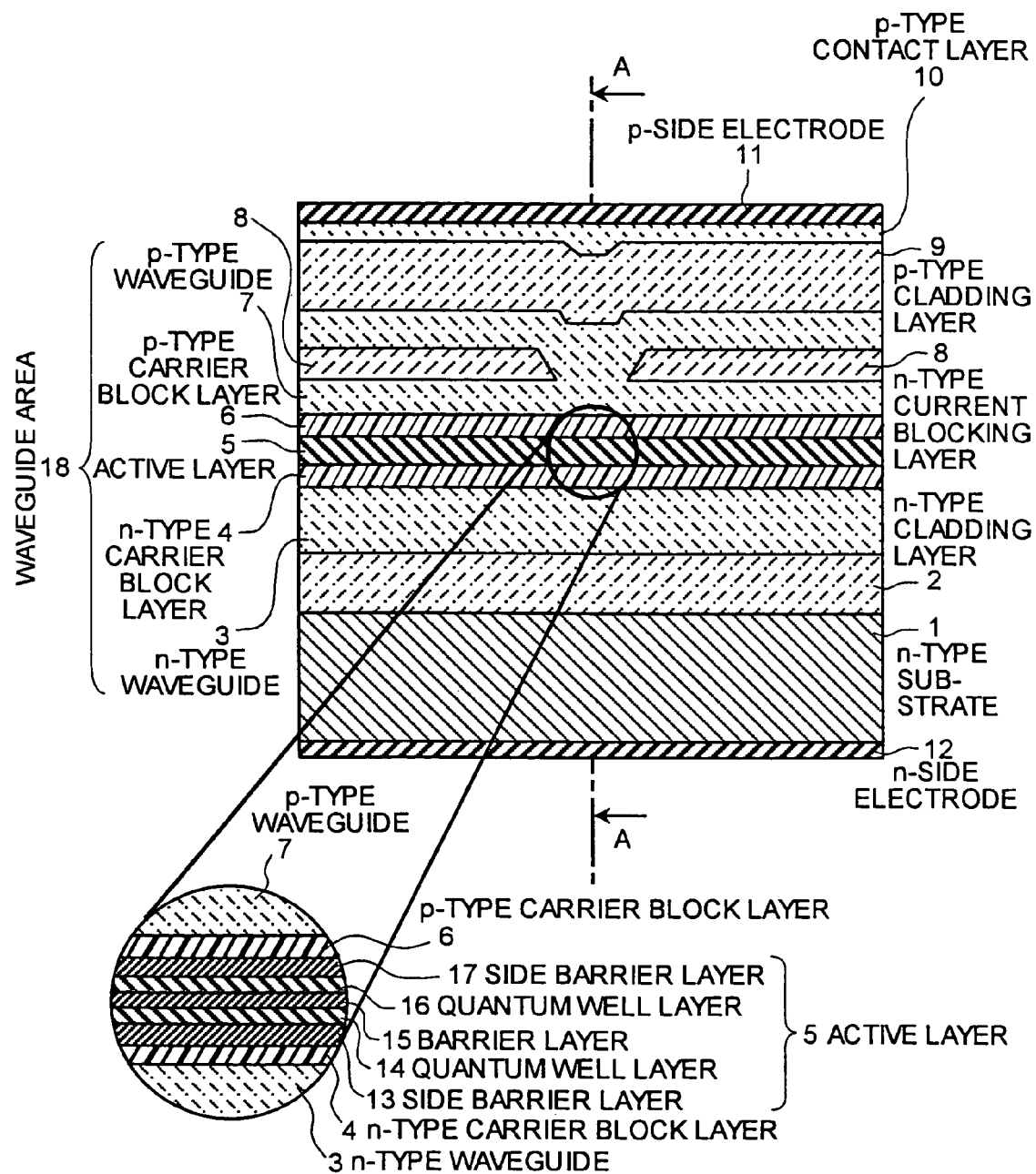
FIG. 1 is a front elevational view of the structure of a semiconductor laser device according to a first embodiment of the present invention.

Exemplary embodiments of a semiconductor laser device, a semiconductor laser module, and an optical fiber amplifier according to the present invention will be explained in detail with reference to the accompanying drawings. The drawings are only schematic, and it should be noted that the relation between thickness and width of respective portions and the ratio of sizes of the respective portions are different from those of the actual ones. It is a matter of course that portions having different relations and ratios in relative sizes are included in the drawings.

Figure 2:
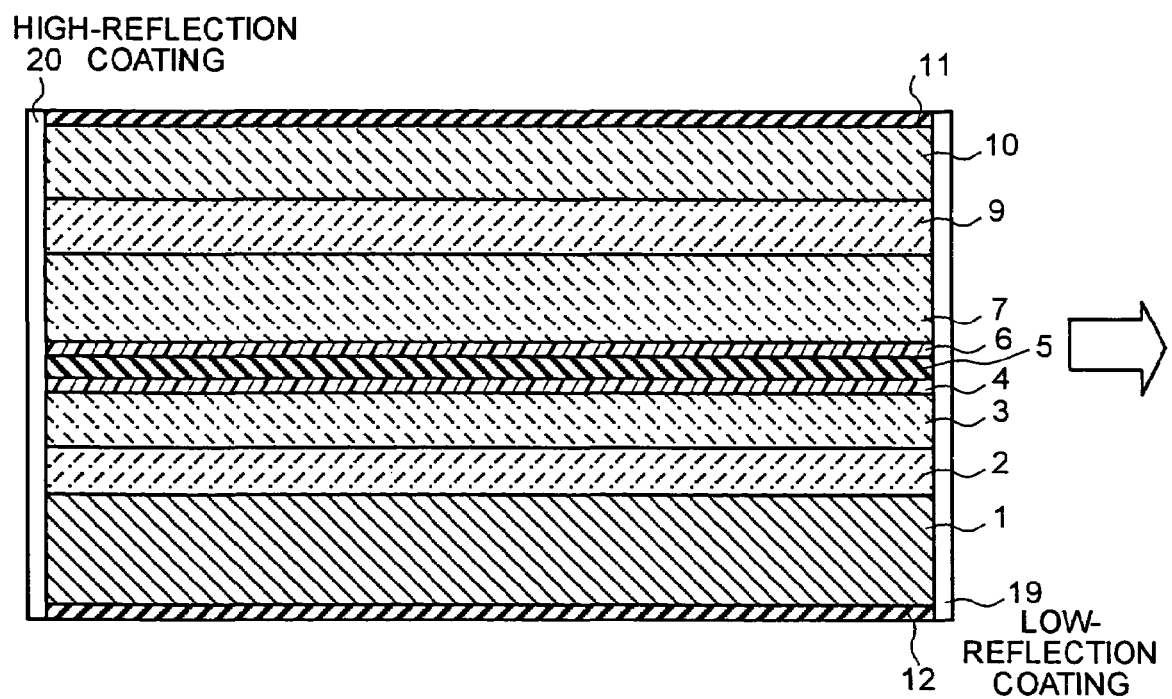
FIG. 2 is a cross section along line A—A of the semiconductor laser device shown in FIG. 1.

FIG. 1 is a front elevational view of the semiconductor laser device according to a first embodiment of the present invention. FIG. 2 is a sectional side view of the structure of the semiconductor laser device according to the first embodiment.

The semiconductor laser device according to the first embodiment is a so-called decoupled confinement heterostructure (DCH) laser. That is, the semiconductor laser device does not have a structure in which light confinement and prevention of overflow of a carrier is performed by a cladding layer, as in a normal double hetero laser, but has a structure having a carrier block layer that prevents the overflow of the carrier, in addition to the cladding layer that performs light confinement.

The specific structure for the semiconductor laser device according to the first embodiment will be explained with reference to FIGS. 1 and 2. In the semiconductor laser device according to the first embodiment, an n-type cladding layer 2, an n-type waveguide 3, an n-type carrier block layer 4, an active layer 5, a p-type carrier block layer 6, and a p-type waveguide 7 are sequentially laminated on an n-type substrate 1. An n-type current blocking layer 8 is arranged in the p-type waveguide 7, in a portion excluding a part of a stripe area in which the longitudinal direction is in parallel with the light emitting direction. A p-type cladding layer 9, a p-type contact layer 10, and a p-side electrode 11 are sequentially laminated on the p-type waveguide 7. An n-side electrode 12 is arranged on the lower face of the n-type substrate 1. Further, as shown in FIG. 2, a low reflection coating 19 is arranged on a facet on the light-emitting side (on a facet on the right side in FIG. 2) and a high reflection coating 20 is arranged on a light reflecting facet opposite to the facet on the light-emitting side (on a facet on the left side in FIG. 2).

The n-type cladding layer 2 and the p-type cladding layer 9 are for confining laser beams generated by carrier recombination in the active layer 5. According to the first embodiment, the semiconductor laser device also has a function of not performing light confinement with respect to the light having a predetermined wavelength other than that of the emitted laser beams. This will be explained later.

The n-type cladding layer 2 and the p-type cladding layer 9 are formed of a material having a lower refractive index than that of the active layer 5, the n-type waveguide 3, and the p-type waveguide 7. According to the first embodiment, the n-type cladding layer 2 is formed of $Al_{0.045}Ga_{0.955}As$, has a layer thickness of 5.820 micrometers, and the p-type cladding layer 9 is formed of $Al_{0.32}Ga_{0.68}As$.

The n-type waveguide 3 and the p-type waveguide 7 are for wave-guiding the laser beams. As described above, in the DCH structure, it is not necessary to reduce the overflow of the carrier by the cladding layer, and hence, the layer thickness of the n-type waveguide 3 and the p-type waveguide 7 can be increased. As a result, a catastrophic optical damage (COD) can be suppressed, thereby realizing a high optical output. The n-type waveguide 3 and the p-type waveguide 7 are formed of GaAs and the layer thickness thereof is 0.470 micrometer according to the first embodiment.

The n-type carrier block layer 4 and the p-type carrier block layer 6 are for confining the injected carriers in the active layer 5, to suppress the overflow of the carriers. Specifically, the n-type carrier block layer 4 and the p-type carrier block layer 6 are formed of a material having a band gap larger than that of the active layer 5 and having a layer thickness sufficiently thin optically. The n-type carrier block layer 4 prevents holes (electron holes), being a minority carrier in the n-type carrier block layer 4 from flowing out to a lower layer and the p-type carrier block layer 6 prevents electrons from flowing out to an upper layer. The n-type carrier block layer 4 and the p-type carrier block layer 6 are formed of $Al_{0.4}Ga_{0.5}As$ and the layer thickness thereof is respectively 0.035 micrometer according to the first embodiment.

The active layer 5 is for generating the laser beams by recombining the injected carriers. Specifically, as shown by an enlarged view of FIG. 1, the active layer 5 has a structure such that two quantum well layers 14 and 16 are respectively put between a side barrier layer 13 or 17 and a barrier layer 15. Since the quantum well layers 14 and 16 are included, there is a quantum confining effect with respect to the carriers, and hence, the carriers can be confined highly efficiently. The quantum well layers 14 and 16 need to have a very thin layer thickness to demonstrate the quantum confining effect, and the respective layer thickness thereof according to the first embodiment is 0.01 micrometer. The composition of the quantum well layers 14 and 16 is $In_{0.14}Ga_{0.86}As$. The side barrier layers 13 and 17, and the barrier layer 15 are respectively formed of GaAs, and the layer thickness of the side barrier layers 13 and 17 is 0.055 micrometer, and the layer thickness of the barrier layer 15 is 0.006 micrometer. The active layer 5 is formed in such a mode, and the semiconductor laser device according to the first embodiment emits laser beams having a wavelength of 980 nanometers. The laser beams wave-guides mainly through the n-type waveguide 3, the p-type waveguide 7, the n-type carrier block layer 4, the p-type carrier block layer 6, and the active layer 5, and hence, these are collectively referred to as a waveguide area 18.

The p-type contact layer 10 is for facilitating ohmic contact with the p-side electrode 11. Specifically, the p-type contact layer 10 is formed by doping GaAs having little oxidization and deterioration with p-type impurities such as zinc (Zn) at a high density. The layer thickness of the contact layer is 1.75 micrometers.

The n-type current blocking layer 8 is for allowing the injected current to flow only to a desired area in the active layer 5. The n-type current blocking layer 8 is formed of a material having a lower refractive index than that of the waveguide layer, thereby enabling formation of a waveguide of an effective refractive index type. As a result, a highly efficient single-mode semiconductor laser can be formed.

The low reflection coating 19 and the high reflection coating 20 shown in FIG. 2 are for forming a resonator. The high reflection coating 20 has a reflectance of equal to or higher than 80 percent, and more preferably, equal to or higher than 98 percent, to efficiently extract the laser beams. On the other hand, the low reflection coating 19 has a coating structure having an optical reflectance equal to or lower than five percent, and preferably, of about one percent, to suppress an instantaneous optical damage on the light emitting facet. However, the optical reflectance of the low-reflection coating 19 is optimized corresponding to the length of the resonator. According to the first embodiment, it is a fiber grating provided in the optical fiber optically coupled with the semiconductor laser device that constitutes the resonator together with the high reflection coating 20. Alternatively, the one that constitutes the resonator together with the high reflection coating 20 may be a distributed feedback type laser structure in which a periodic slot structure is provided in a part of the n-type waveguide 3 or the p-type waveguide 7 of the semiconductor laser device, or a distributed Bragg reflective laser structure.

The semiconductor laser device according to the first embodiment has a function of allowing the light, which is input from the outside and has a wavelength different from the emitted wavelength, to leak out inside the semiconductor laser device. This function will be explained below. As one example of the incident light from the outside, an instance in which light having the wavelength of 1550 nanometers enters into the semiconductor laser device according to the first embodiment from the outside is considered.

Figure 3:
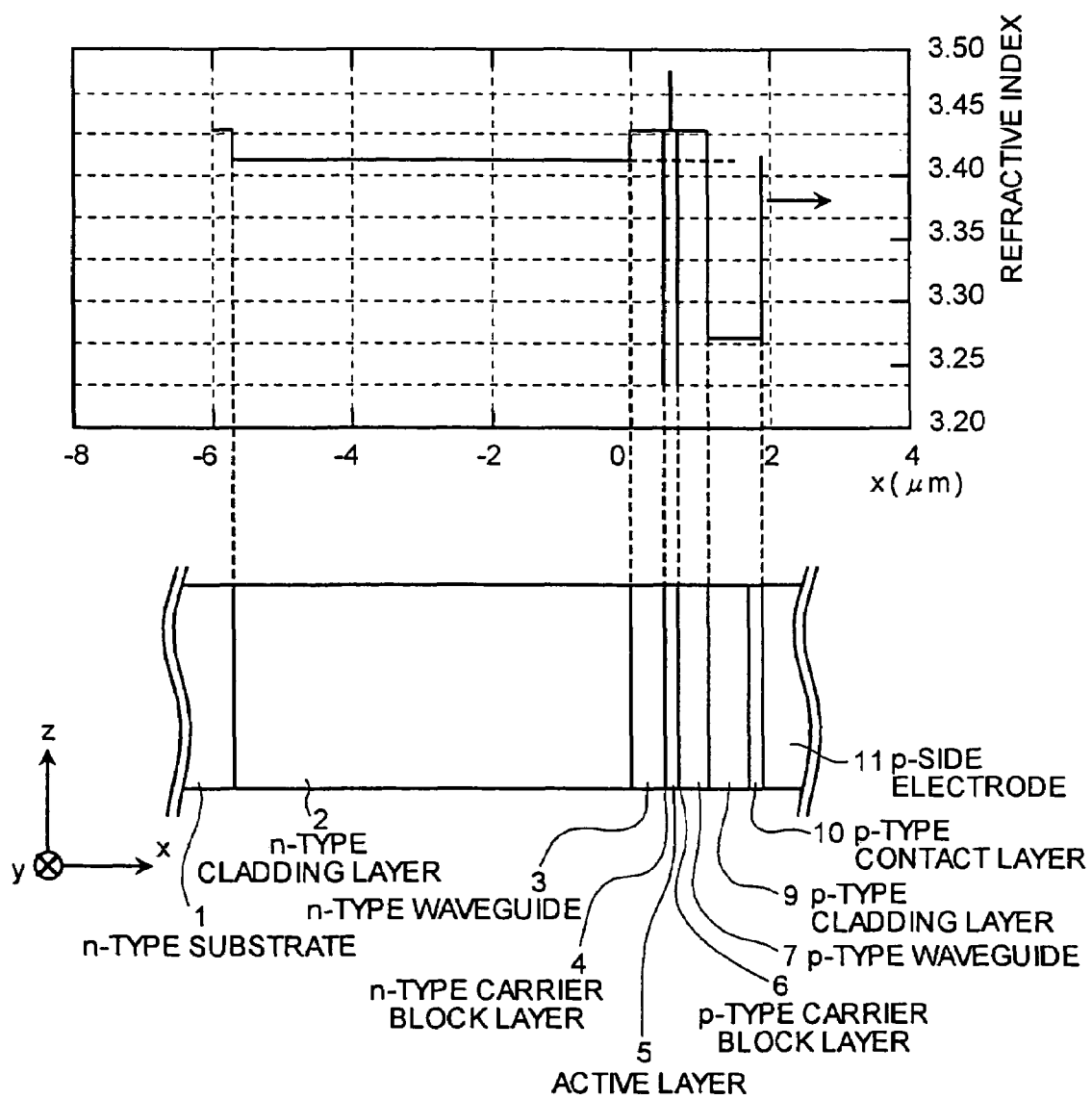
FIG. 3 is a graph of a refractive index distribution and an effective refractive index of the semiconductor laser device according to the first embodiment with respect to light having a wavelength of 1550 nanometers.

FIG. 3 is a graph of a refractive index distribution in the semiconductor laser device according to the first embodiment and an effective refractive index of the semiconductor laser device. Solid line in FIG. 3 indicates a refractive index of the respective layers. The dotted line indicates the effective refractive index. In FIG. 3, a cross section of the semiconductor laser device according to the present invention is attached below the graph, so that the relation between respective layers and the refractive index distribution becomes clear. In the graph of FIG. 3, the lamination direction of the respective layers constituting the semiconductor laser device according to the present invention is plotted on the horizontal axis, and an origin of the horizontal axis is set on a boundary between the n-type cladding layer 2 and the n-type waveguide 3.

Since the wavelength of the incident light from the outside is 1550 nanometers, the refractive index of respective layers shown in FIG. 3 indicates the refractive index with respect to the light having the wavelength of 1550 nanometers. Specifically, the refractive index of the n-type cladding layer 2 with respect to the light having the wavelength of 1550 nanometers is 3.413, and the refractive index of the n-type waveguide 3 and the p-type waveguide 7 is 3.436, respectively. The refractive index of the p-type cladding layer 9 is 3.274. The refractive index of the n-type carrier block layer 4 and the p-type carrier block layer 6 is respectively 3.233, and the refractive index of the side barrier layers 13 and 17 is respectively 3.436, and the refractive index of the quantum well layers 14 and 16 is respectively 3.481. The refractive index distribution in FIG. 3 is indicated based on these values.

The refractive index distribution shown in FIG. 3 can be derived from a specific structure including the layer thickness of respective layers constituting the semiconductor laser device, the refractive index and the like. The derivation method thereof will be explained here.

The light intensity distribution and the effective refractive index can be calculated from a solution of a predetermined wave equation and an eigen-value. The wave equation for deriving the light intensity distribution and the effective refractive index is:

$$[\nabla_t^2 + \{k_0^2 n^2(x, y) - \beta^2\}] E(x, y) = 0 \quad (1)$$

where the outgoing direction of the laser beams is plotted on the z axis, and the lamination direction of respective layers (that is, the direction of the x axis in FIG. 3) is plotted on the x axis. $\nabla_t$ is $(\partial/\partial_x, \partial/\partial_y, 0)$, and $E(x, y)$ indicates an electric field vector on coordinates $(x, y)$. Further, $n(x, y)$ indicates the refractive index on the coordinates $(x, y)$ and $k_0$ indicates a wave number. $\beta$ is the eigenvalue of the electric field vector $E(x, y)$ in the equation (1). Since the structure of the semiconductor laser device is identical in the z direction, the electric field vector E(x, y) and the refractive index n(x, y) do not depend on the z coordinate.

By solving the equation (1) under the boundary condition that the field vector E(x, y) comes closer to zero gradually at a finite distance, the field vector E(x, y) can be obtained, and the light intensity distribution can be obtained from the intensity distribution of the field vector E(x, y). However, in FIG. 3, the light intensity distribution is not displayed. The effective refractive index N is expressed as:

$$N=\beta/k_0 \quad (2)$$

by using the eigenvalue $\beta$ obtained from the equation (1). Therefore, by using the equation (2), the effective refractive index N can be derived from the eigenvalue $\beta$ in the equation (1). According to the first embodiment, as a result of solving the equations (1) and (2), taking into consideration specific numerical values of the refractive index and the layer thickness of the respective layers, the effective refractive index with respect to the light having the wavelength of 1550 nanometers becomes 3.413.

Under the refractive index distribution as shown in FIG. 3, in the semiconductor laser device according to the first embodiment, the light intensity takes a maximum value at x=0, with respect to the light having the wavelength of 1550 nanometers. The light intensity does not particularly decrease even in the area of x<0, that is, in the n-type cladding layer 2, and keeps the value at x=0. Therefore, when the light having the wavelength of 1550 nanometers enters from the outside, in the semiconductor laser device according to the first embodiment, the light intensity is high in the n-type cladding layer 2, rather than in the waveguide area 18. Hence, it is clear that the incident light from the outside is not confined within the waveguide area 18. In other words, the incident light from the outside is not confined within the waveguide area 18, but leaks out toward the n-type cladding layer 2 outside the waveguide area 18.

The semiconductor laser device according to the first embodiment has a structure such that the refractive index of the n-type cladding layer 2 has the same value as the effective refractive index with respect to the light having the wavelength of 1550 nanometers. Thus, when the refractive index of the cladding layer has a value as high as being equal to or higher than the effective refractive index with respect to the light having a predetermined wavelength, the semiconductor laser device does not confine the light having the predetermined wavelength within the waveguide area 18.

Figure 4A:
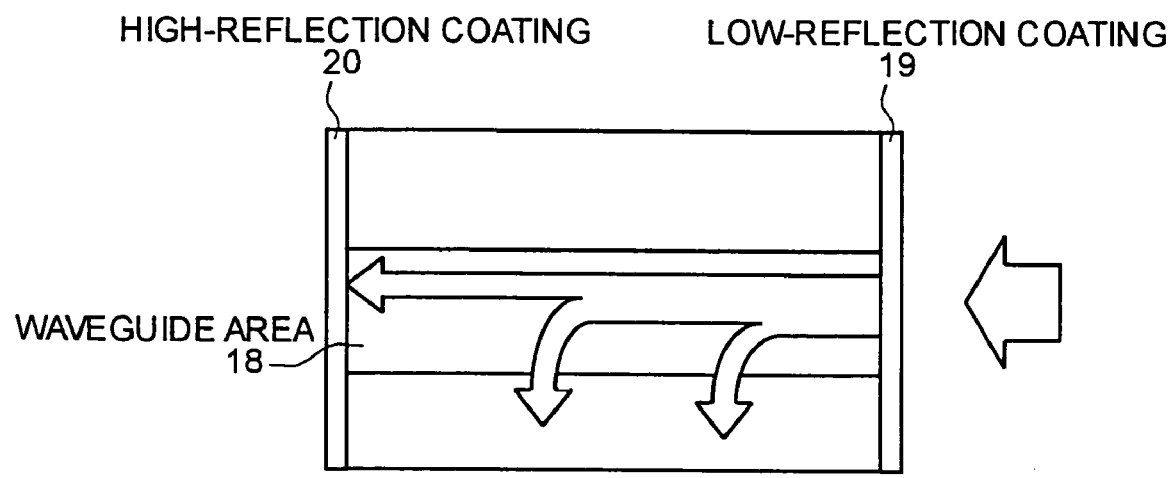
FIGS. 4A and 4B are diagrams of a mode of light leakage when light having a wavelength of 1550 nanometers enters into the semiconductor laser device according to the first embodiment from outside.
Figure 4B:
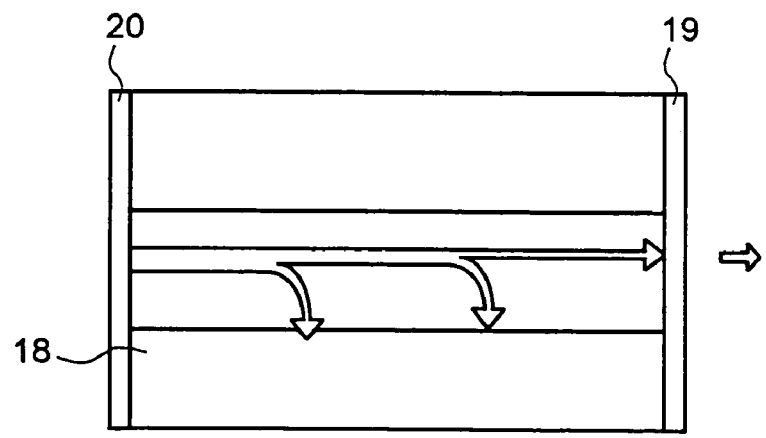

An advantage obtained by the fact that the effective refractive index with respect to the light having the wavelength of 1550 nanometers entering from the outside is not larger than the refractive index of the n-type cladding layer 2, and the light intensity has the distribution described above will be explained next. FIGS. 4(a) and 4(b) are diagrams of the state of light transmission within the semiconductor laser device, when the light having the wavelength of 1550 nanometers from the outside enters, through the low reflection coating 19, into the semiconductor laser device according to the first embodiment from outside.

The light entering into the semiconductor laser device via the low reflection coating 19 from the outside generally travels toward the high reflection coating 20. The semiconductor laser device according to the first embodiment, however, has a structure such that it does not confine the light having the wavelength of 1550 nanometers within the waveguide area 18. Therefore, the light entering from the outside leaks out toward the n-type cladding layer 2 as it travels, and the most part of the incident light is discharged to the substrate, as shown in FIG. 4A, passing through the n-type cladding layer 2, before reaching the high reflection coating 20. Further, the same theory applies to the light reached the high reflection coating 20 and reflected therefrom. The reflected light is not confined within the waveguide area 18, but leaks out toward the n-type cladding layer 2 on the way back toward the low reflection coating 19, passes through the n-type cladding layer 2, and is discharged to the substrate. Therefore, the light emitted from the low reflection coating 19, as shown in FIG. 4B, has only a little intensity as compared with the incident light, or is not present at all.

Therefore, in the semiconductor laser device according to the first embodiment, when the light having the wavelength of 1550 nanometers, different from the wavelength of the emitted laser beams, enters into the semiconductor laser device, there is an advantage in that it can prevent the incident light from being reflected by the high reflection coating 20 and emitted again from the low reflection coating 19.

On the other hand, even when the incident light from the outside can be prevented from being emitted again, if the semiconductor laser device according to the first embodiment cannot function as a laser beam light source, there is a problem as a semiconductor laser device. That is, it is necessary that the semiconductor laser device has a structure such that it confines light having a wavelength of 980 nanometers, being a wavelength of the laser beams emitted from the semiconductor laser device, within the waveguide area 18. This will be explained below.

Figure 5:
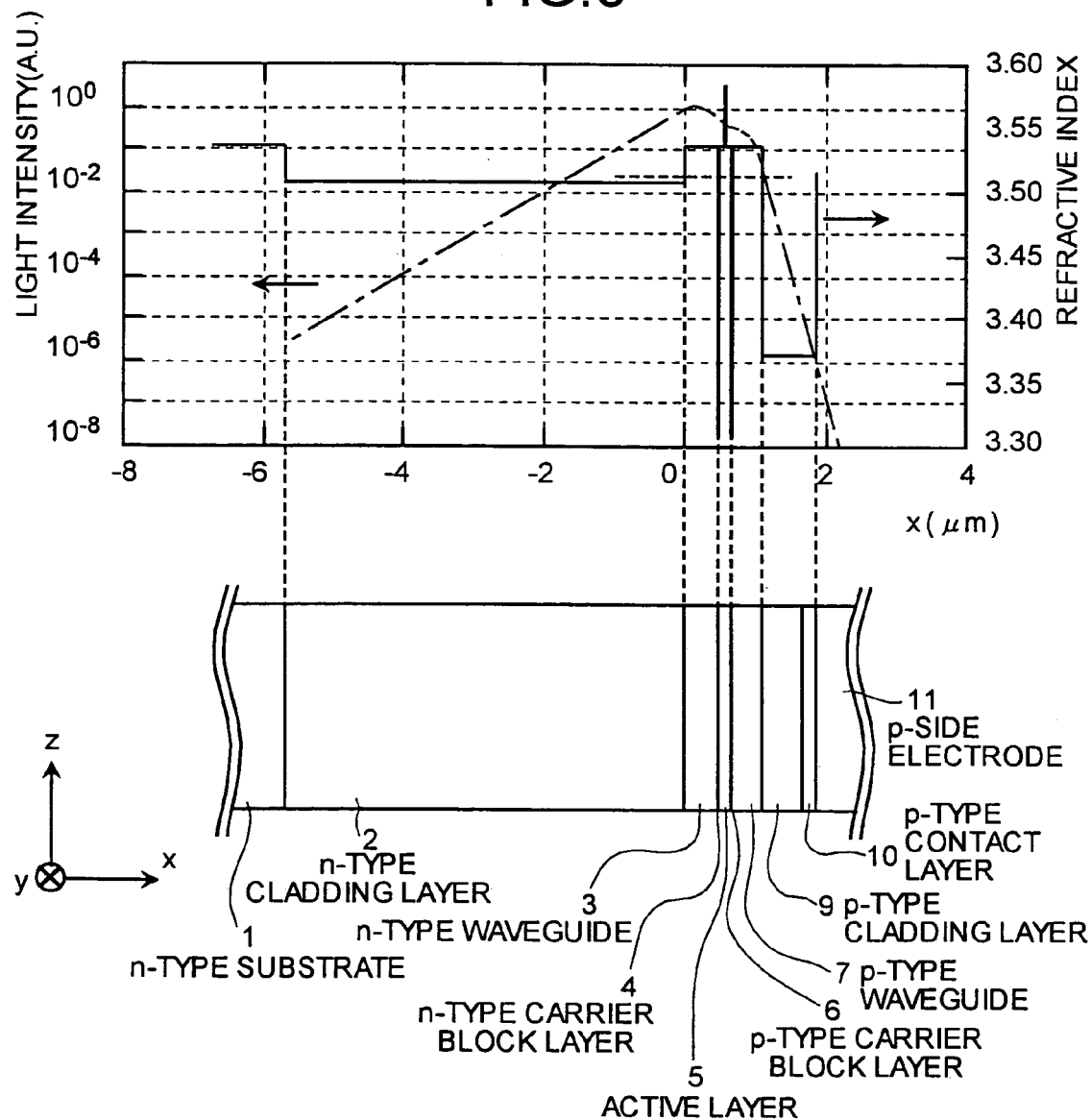
FIG. 5 is a graph of a refractive index distribution, a light intensity distribution, and an effective refractive index with respect to light having a wavelength of 980 nanometers, of the semiconductor laser device according to the first embodiment.

FIG. 5 is a graph of the light intensity distribution, the refractive index distribution, and the effective refractive index of the semiconductor laser device according to the first embodiment with respect to the light having the wavelength of 980 nanometers, being a wavelength of the emitted laser beams. Generally, the refractive index changes depending on the wavelength.

The refractive index of the respective layers with respect to the light having the wavelength of 980 nanometers is, respectively, 3.511 for the n-type cladding layer 2, 3.537 for the n-type waveguide 3 and the p-type waveguide 7, and 3.306 for the n-type carrier block layer 4 and the p-type carrier block layer 6. The refractive index of the p-type cladding layer 9 is 3.352. The refractive index of the side barrier layers 13 and 17 and the barrier layer 15 constituting the active layer 5 is 3.537, and the refractive index of the quantum well layers 14 and 16 is 3.591.

The light intensity distribution can be obtained by solving the wave equation (1) with respect to the field vector E(x, y). The effective refractive index can be also obtained by solving the equations (1) and (2), and it is shown that the effective refractive index with respect to the light having the wavelength of 980 nanometers is 3.515.

In order to allow the emitted laser beams to propagate only in the waveguide area 18, in the semiconductor laser device according to the first embodiment, the n-type cladding layer 2 and the p-type cladding layer 9 have a low refractive index. However, light confinement does not occur when these have any value lower than the refractive index of the active layer 5, the n-type waveguide 3, and the p-type waveguide 7. Generally, when the refractive indexes of the n-type cladding layer 2 and the p-type cladding layer 9 become lower than the effective refractive index of the semiconductor laser device, the semiconductor laser device can effect the light confinement.

As described above, with respect to the light having the wavelength of 980 nanometers, the refractive index of the n-type cladding layer 2 is 3.511, the refractive index of the p-type cladding layer 9 is 3.352, whereas the effective refractive index of the semiconductor laser device according to the first embodiment is 3.515. Therefore, the refractive indexes of the n-type cladding layer 2 and the p-type cladding layer 9 become lower than the effective refractive index with respect to the light having the wavelength of 980 nanometers, and hence, the emitted laser beams having the wavelength of 980 nanometers are effectively confined within the waveguide area 18, and laser oscillation is effected by the stimulated emission phenomenon. When the light intensity distribution in FIG. 5 is actually observed, the light intensity has a maximum value near x=0, and the light intensity rapidly decreases as the absolute value on the x coordinate increases, indicating that the light is confined within the waveguide area 18.

Figure 6:
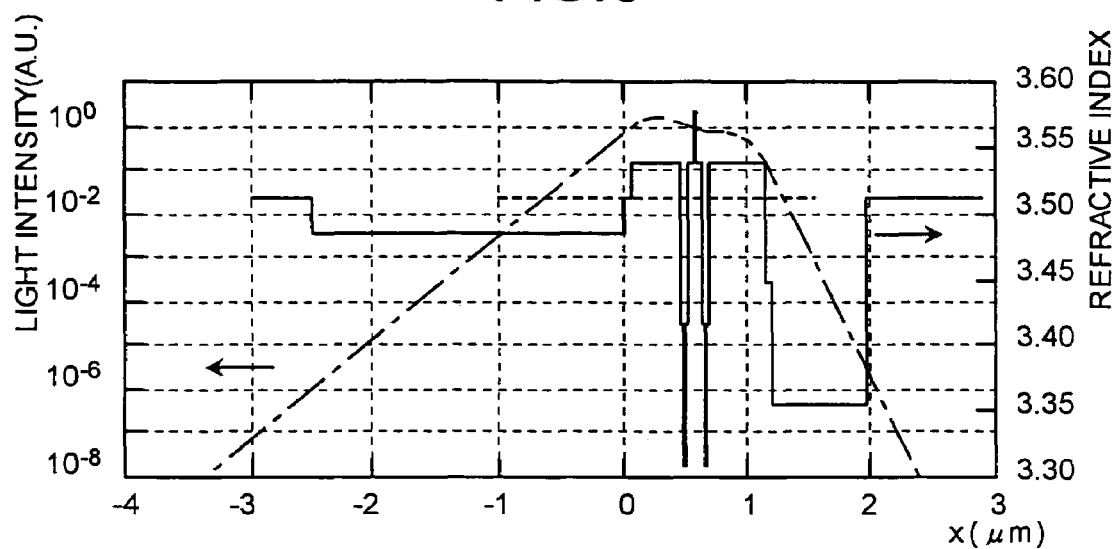
FIG. 6 is a graph of a refractive index distribution, a light intensity distribution, and an effective refractive index with respect to light having a wavelength of 980 nanometers, in a DCH laser in a comparative example.
Figure 7:
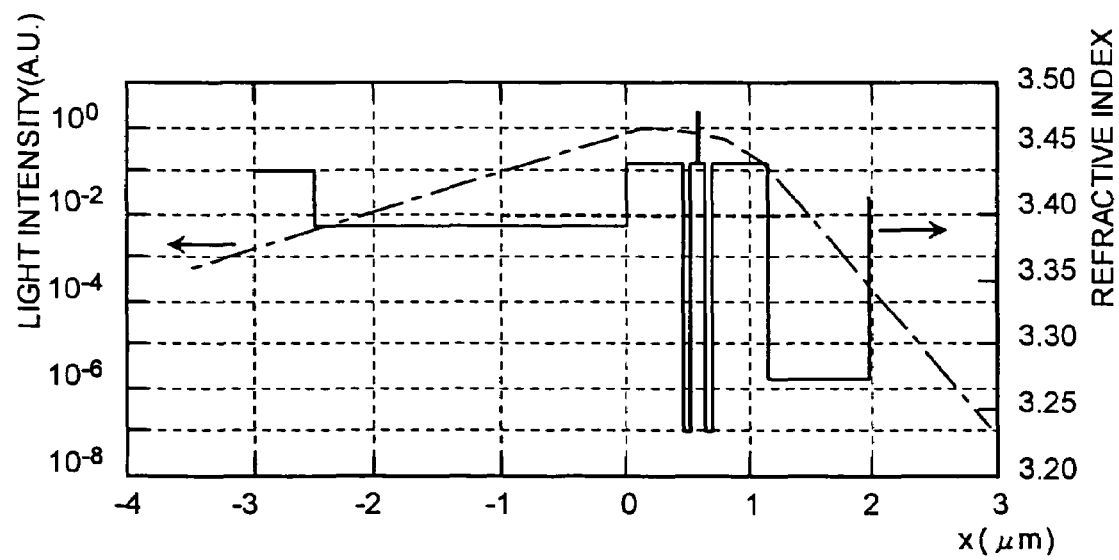
FIG. 7 is a graph of a refractive index distribution, a light intensity distribution, and an effective refractive index with respect to light having the wavelength of 1550 nanometers, in the DCH laser in the comparative example.

For the comparison with the semiconductor laser device according to the first embodiment, the light intensity distribution, the refractive index distribution, and the effective refractive index of the conventional DCH laser are shown in FIGS. 6 and 7. FIG. 6 is a graph of the refractive index distribution and the light intensity distribution with respect to the light having the wavelength of 980 nanometers, being the emitted wavelength from the conventional DCH laser, and FIG. 7 is a graph of the refractive index distribution and the light intensity distribution with respect to the light having the wavelength of 1550 nanometers. In the graphs shown in FIGS. 6 and 7, the light intensity distribution and the effective refractive index are obtained from the equations (1) and (2), as in the case of FIG. 5.

The conventional DCH laser has basically the same structure as that of the semiconductor laser device according to the first embodiment, but different in that the n-type cladding layer is formed of $Al_{0.09}Ga_{0.91}As$, the layer thickness thereof is 2.5 micrometers, and the layer thickness of the p-type cladding layer is 0.845 micrometer.

The optical characteristics thereof are different from those of the semiconductor laser device according to the first embodiment in the refractive index and the effective refractive index of the n-type cladding layer with respect to the respective wavelengths. Specifically, with respect to the wavelength of 980 nanometers, the refractive index of the n-type cladding layer is 3.484, and the effective refractive index becomes 3.509 from the equations (1) and (2). On the other hand, with respect to the wavelength of 1550 nanometers, the refractive index of the n-type cladding layer is 3.391, and the effective refractive index is 3.401.

Therefore, in the conventional DCH laser, the refractive index of the n-type cladding layer and the p-type cladding layer is smaller than the effective refractive index with respect to the wavelength of 980 nanometers, being the emitted wavelength. Also with respect to the wavelength of 1550 nanometers, the refractive index of the n-type cladding layer and the p-type cladding layer is smaller than the effective refractive index.

It can be considered that since the refractive index of the n-type cladding layer becomes smaller than the effective refractive index, with respect to the both wavelengths, in the conventional DCH laser, the light confinement effect occurs with respect to not only the light having the wavelength of 980 nanometers, but also the light having the wavelength of 1550 nanometers.

When the light intensity distribution in FIGS. 6 and 7 is actually observed, in the conventional DCH laser, light confinement occurs with respect to not only the light having the wavelength of 980 nanometers, but also the light having the wavelength of 1550 nanometers. Therefore, when the light having the wavelength of 1550 nanometers enters from the outside, the light is confined within the waveguide area, is transmitted from the low reflection coating 19 to the high reflection coating 20, without being attenuated, reflected by the high reflection coating 20, and is emitted again from the low reflection coating 19. Therefore, when for example the conventional DCH laser is used as the pump light source of the optical fiber amplifier, a part of the signal light having the wavelength of 1550 nanometers enters into the conventional DCH laser, is reflected on the light reflecting facet in the DCH laser, and emitted again. The semiconductor laser device according to the first embodiment does not have such a problem, since the light having the wavelength of 1550 nanometers leaks out.

The confinement of the light having wavelength of 980 nanometers, being the wavelength emitted from the semiconductor laser device, is compared with that of the conventional DCH laser. When comparing the light intensity distribution of the light having wavelength of 980 nanometers of the semiconductor laser device according to the first embodiment shown in FIG. 5 with that of the conventional DCH laser shown in FIG. 6, it can be seen that in the semiconductor laser device according to the first embodiment, laser beams are efficiently confined within the waveguide area, with no practical problem entailed, although the light may be confined slightly more efficiently in the conventional DCH laser.

Therefore, the semiconductor laser device according to the first embodiment is capable of confining the light having wavelength of 980 nanometers, at which it emits laser beam within the waveguide area to such a degree that it has no practical problem, as compared with the conventional DCH laser, so that it can lase as efficiently as the conventional DCH laser.

On the other hand, with respect the light having the wavelength of 1550 nanometers, as shown in FIG. 3, the light is not confined within the waveguide area, leaks out toward the n-type cladding layer 2, and is discharged to the outside. Therefore, different from the conventional DCH laser, the semiconductor laser device according to the first embodiment can effectively allow the incident light from the outside to leak out, and hence, does not emit the light having the wavelength of 1550 nanometers from the light emitting facet, or even if the light is emitted, it is very weak.

Therefore, for example, when the semiconductor laser device according to the first embodiment is used for the pump light source of the optical fiber amplifier, such as the EDFA, a noise component having the same wavelength as that of the signal light can be prevented from being generated. Further, laser beams having a predetermined wavelength can be stably emitted, regardless of the presence of the incident light from the outside.

In the semiconductor laser device according to the first embodiment, the layer thickness of the n-type cladding layer 2 is increased, as compared with the conventional DCH laser. Generally, it is known that an electrical resistance and a heat resistance inside the semiconductor laser device increase with an increase in the layer thickness, but according to the first embodiment, it is not a problem. It is because, generally, in the semiconductor material, n-type impurities can be doped in a relatively large amount, and by doping the impurities in a large amount, the electrical conductivity and the thermal conductivity can be improved. Therefore, the semiconductor laser device according to the first embodiment does not have such a problem that it is inferior to the conventional DCH laser in the electrical resistance and the heat resistance. In the semiconductor laser device according to the first embodiment, since the aluminum composition in the n-type cladding layer 2 is decreased as compared with the conventional DCH laser, the electrical resistance and the heat resistance can be reduced.

In the semiconductor laser device according to the first embodiment, the p-type cladding layer 9 is formed of the same semiconductor layer as that of the conventional DCH laser, and the layer thickness thereof is made thinner. By having such a structure, the effective refractive index with respect to the light having the wavelength of 1550 nanometers is decreased, and additionally, there is a secondary effect. The semiconductor laser device is generally fixed on a mount having good thermal conductivity, so as to remove the generated heat onto the mount, to suppress a temperature rise of the active layer 5. The semiconductor laser device is fixed on the mount in a so-called junction down configuration, with the p-side electrode 11 coming into contact with the mount. In the semiconductor laser device according to the first embodiment, since the thickness of the p-type cladding layer 9 can be made thin, the heat generated in the active layer 5 can be efficiently discharged.

According to the first embodiment, an instance in which the wavelength of the incident light from the outside is 1550 nanometers has been explained, but the wavelength of light is not limited to 1550 nanometers. Further, the emitted wavelength from the semiconductor laser device is not necessarily limited to 980 nanometers. It is determined only by the correlation between the refractive index and the effective refractive index of the cladding layer whether the incident light from the outside leaks out inside the semiconductor laser device, regardless of the emitted wavelength from the semiconductor laser device. In other words, the structure of the semiconductor laser device can be designed so that the effective refractive index of the semiconductor laser device becomes equal to or lower than the refractive index of the cladding layer, with respect to the incident light of a predetermined wavelength. When the wavelength of the incident light from the outside approximates to the emitted wavelength from the semiconductor laser device, it is not easy to allow the incident light from the outside to leak out. Therefore, it is desired that a difference between the wavelength of the incident light and the emitted wavelength be equal to or more than 200 nanometers. For example, when the emitted wavelength from the semiconductor laser device is from 950 to 1100 nanometers, and the wavelength of the incident light from the outside is from 1500 to 1600 nanometers, the incident light from the outside can be easily allowed to leak out, while ensuring sufficient light confinement for the emitted laser beams.

According to the first embodiment, the structure of the semiconductor laser device is determined so that the refractive index of the n-type cladding layer 2 becomes the same as the effective refractive index, with respect to the incident light from the outside. However, the structure thereof is not limited to the one in which the refractive index of the n-type cladding layer 2 is the same as the effective refractive index. Even when the refractive index of the n-type cladding layer 2 is higher than the effective refractive index with respect to the wavelength of the incident light, the incident light can be allowed to leak out. The composition and the layer thickness of the respective layers are not limited to the values described above. The structure of the semiconductor laser device can be changed according to the application, the production cost or the like of the semiconductor laser device. Further, the semiconductor laser device may be designed so that the refractive index of the p-type cladding layer 9 is equal to or higher than the effective refractive index, with respect to the incident light from the outside, instead of having the structure in which the refractive index of the n-type cladding layer 2 is higher than the effective refractive index.

The semiconductor laser device may be formed such that the refractive indexes of the n-type cladding layer 2 and the p-type cladding layer 9 become higher than the effective refractive index, respectively. In this case, since the incident light from the outside is allowed to leak out not only to the n-type cladding layer 2 but also to the p-type cladding layer 9, the incident light from the outside can be attenuated more effectively.

According to the first embodiment, the effective refractive index is decreased and the refractive index of the n-type cladding layer 2 is set high with respect to the incident light from the outside, and by changing the composition and layer thickness of the semiconductor mixed crystal constituting the n-type cladding layer 2. However, the present invention is not limited to such a structure. For example, the material of the n-type waveguide 3 or the p-type waveguide 7 may be changed to decrease the effective refractive index. In other words, the semiconductor laser device according to the first embodiment can be realized by increasing the refractive index of the cladding layer as compared to that of the conventional laser device, or suppressing the effective refractive index of the semiconductor laser device. Further, in order to decrease the effective refractive index, the composition and the layer thickness of the layer other than the cladding layer, such as the active layer 5 and the n-type waveguide 3, may be adjusted.

The semiconductor laser device may have a structure such that when light having a plurality of different wavelengths or light in a certain wavelength range enters from the outside, the light leaks out within the semiconductor laser device. Such a semiconductor laser device can be realized by constituting such that the refractive index of the cladding layer in the respective wavelengths becomes lower than the effective refractive index.

Even when the refractive index of the n-type cladding layer 2 is lower than the effective refractive index with respect to the incident light from the outside, but when the difference is small, and the refractive index of the n-type cladding layer and the p-type cladding layer is lower than the effective refractive index with respect to the emitted wavelength, the incident light from the outside is hardly confined within the waveguide area, and hence, is not emitted from the light emitting facet, or even if the light is emitted, it is very weak. However, as is seen from FIG. 7 depicting the refractive index distribution with respect to the light having the wavelength of 1550 nanometers in the DCH laser in the comparative example, when the effective refractive index exceeds 1.003 times as large as the refractive index of the n-type cladding layer 2, the incident light from the outside is confined within the waveguide area. In order to obtain the above effect, therefore, it is desired that the effective refractive index be not larger than 1.003 times as large as the refractive index of the n-type cladding layer 2 with respect to the incident light from the outside.

The semiconductor material forming the respective layers is not limited to those described above. The substrate may be not only the n-type conduction type but also the p-type conduction type, and the structure may be such that the p-type cladding layer, the p-type waveguide and the like are sequentially laminated on the p-type substrate.

Figure 8:
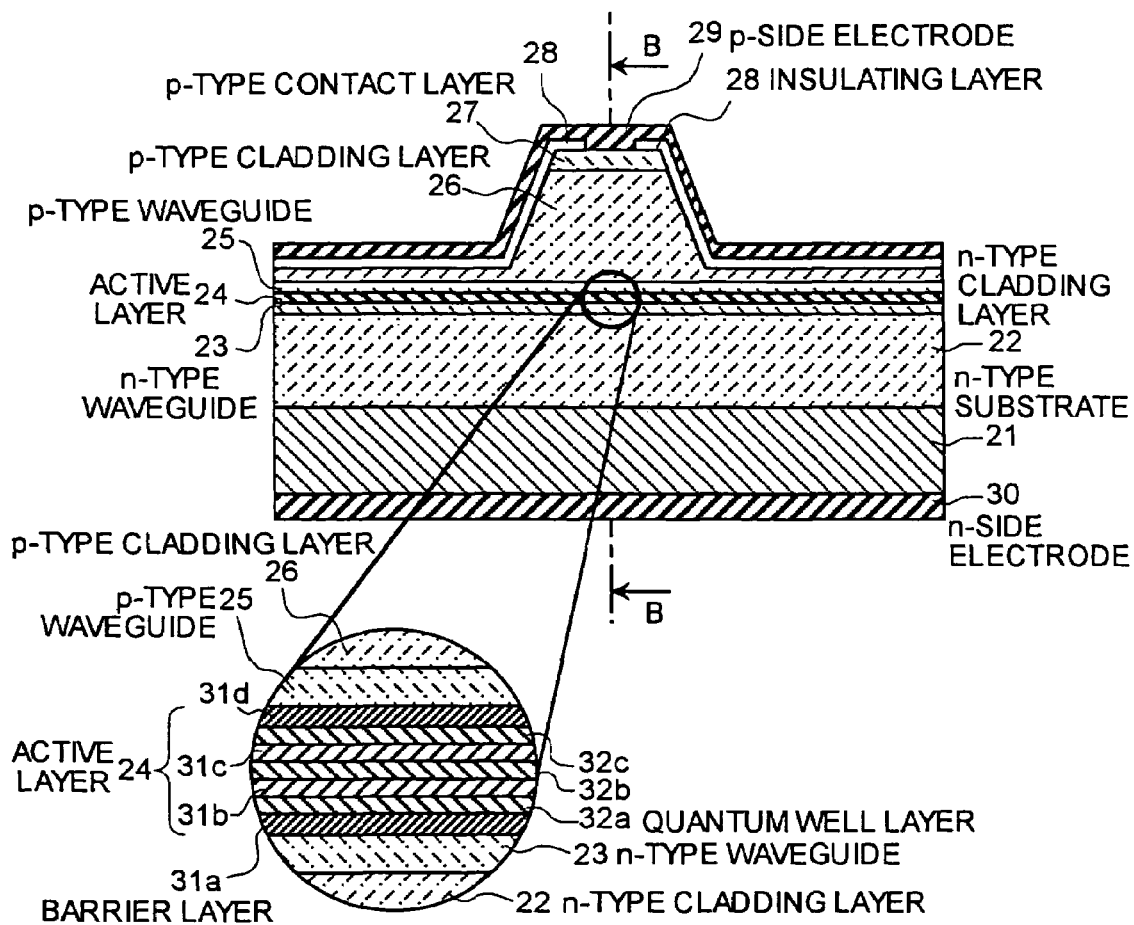
FIG. 8 is a front elevational view of the structure of the semiconductor laser device according to a second embodiment of the present invention.
Figure 9:
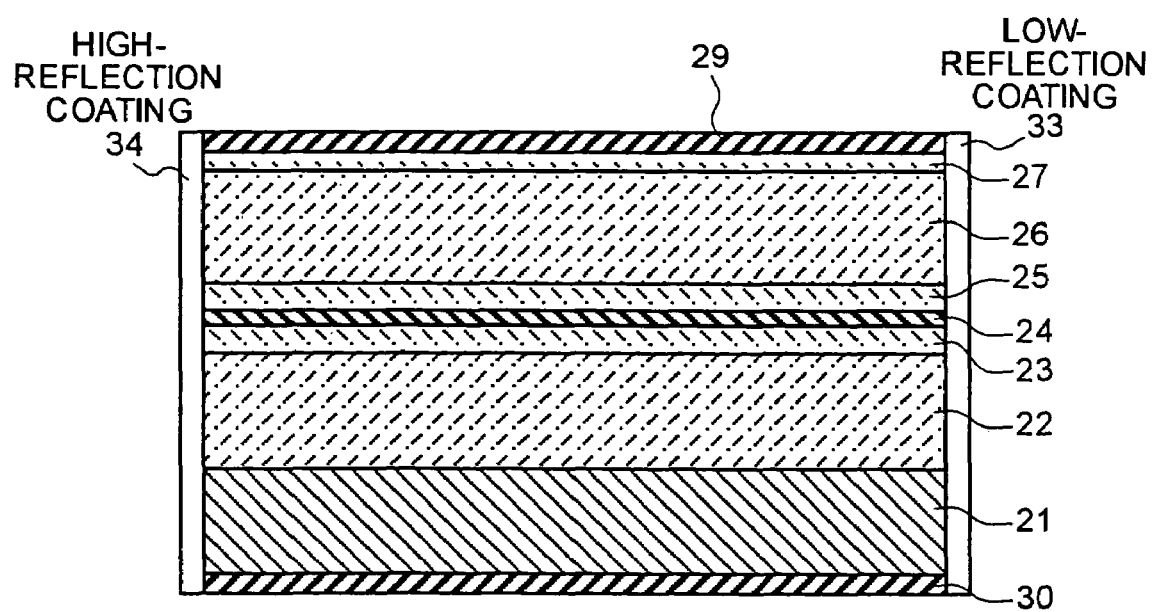
FIG. 9 is a cross section along line B—B in FIG. 8.

FIG. 8 is a schematic cross section of the structure of the semiconductor laser device according to a second embodiment of the present invention. FIG. 9 is a cross section along line B—B in FIG. 8. The semiconductor laser device according to the second embodiment has a so-called ridge structure. The structure of the semiconductor laser device according to the second embodiment will be explained below. Like reference signs designate like semiconductor layers according to the first embodiment, and it is assumed that these have the same function, unless specified otherwise.

In the semiconductor laser device according to the second embodiment, as shown in FIG. 8, an n-type cladding layer 22, an n-type waveguide 23, an active layer 24, a p-type waveguide 25, and a p-type cladding layer 26 are sequentially laminated on an n-type substrate 21. The p-type cladding layer 26 is patterned into a mesa stripe in the upper region thereof, and the vertical width of the upper region of the p-type cladding layer 26 with respect to the laser beam outgoing direction is narrower than the width of the n-type substrate 21. A p-type contact layer 27 is laminated on the upper end of the p-type cladding layer 26, and the most part of the upper face of the p-type cladding layer 26 and the p-type contact layer 27 is covered with an insulating layer 28. The portion, which is not covered with the insulating layer 28, on the upper face of the p-type cladding layer 26, is a striped region having a longitudinal direction in the laser beam outgoing direction. A p-side electrode 29 is arranged on the insulating layer 28 and the exposed p-type contact layer 27. Further, an n-side electrode 30 is arranged on the lower face of the n-type substrate 21.

The active layer 24 has a so-called multiple quantum well structure, wherein a barrier layer 31a, a quantum well layer 32a, a barrier layer 31b, a quantum well layer 32b, a barrier layer 31c, a quantum well layer 32c, and a barrier layer 31d are sequentially laminated from the bottom.

The insulating layer 28 is for allowing the current injected from the p-side electrode 29 to flow only to a part of regions inside the semiconductor laser device. Due to the presence of the insulating layer 28, the current injected from the p-side electrode 29 flows into the semiconductor laser device only from a part of the striped region where there is no insulating layer 28, on the upper face of the p-type contact layer 27. Thus, by narrowing the region where the current flows, high-density current can be injected, thereby improving the luminous efficiency. Therefore, the insulating layer 28 may not be formed of an insulating material, as long as it has the function as a current blocking layer, and functions as the current blocking layer. For example, the current can be prevented from flowing into the semiconductor laser device, even when the insulating layer 28 is formed of an n-type semiconductor layer.

With respect to the semiconductor laser device having such a so-called ridge structure, the incident light from the outside can be diffused within the semiconductor laser device. As explained in the first embodiment, the semiconductor laser device needs only to be designed so that the refractive index of at least one of the n-type cladding layer 22 and the p-type cladding layer 26 becomes equal to or higher than the effective refractive index, with respect to the wavelength of the incident light from the outside. With respect to light having a wavelength of the emitted laser beams, the semiconductor laser device is designed so that the refractive indexes of both the n-type cladding layer 22 and the p-type cladding layer 26 become lower than the effective refractive index. By having such a structure, in the semiconductor laser device according to the second embodiment, light confinement is effected in the waveguide area with respect to the light having the emitted wavelength, but the incident light from the outside is allowed to leak out to the outside of the waveguide area. As in the first embodiment, it is a matter of course that the semiconductor laser device has such a structure that the refractive indexes of the n-type cladding layer 22 and the p-type cladding layer 26 become lower than the effective refractive index, with respect to the light having the emitted wavelength.

As in the first embodiment, when the refractive index of the cladding layer is made higher than the effective refractive index by using a material having a high refractive index for the cladding layer and increasing the layer thickness, it is desired according to the second embodiment to increase the refractive index of the p-type cladding layer 26. When the same method as in the first embodiment is used, by increasing the layer thickness of the cladding layer having a high refractive index, the heat resistance and the electrical resistance of the cladding layer increase. However, since the semiconductor laser device according to the second embodiment has the ridge structure, when it is fixed on the mount, it is fixed so that the n-side electrode 30 comes into contact with the upper face of the mount. Since the mount has a function as a heat sink for discharging the heat generated in the semiconductor laser device to the outside, it is not an advantageous way to increase the heat resistance of the n-type cladding layer 22 located between the active layer 24 and the n-side electrode 30. By having a structure such that the refractive index of the p-type cladding layer 26 is higher than the effective refractive index, the n-type cladding layer 22 can maintain the layer thickness equal to that of the conventional semiconductor laser device, and hence, the heat radiation efficiency is not deteriorated. Further, when the refractive index of the p-type cladding layer 26 is increased and the layer thickness thereof is also increased, it is desired to increase the density of impurities doped on the p-type cladding layer 26, in order to suppress an increase in the electrical resistance.

Even in the ridge laser, not in the DCH laser such as the semiconductor laser device according to the first embodiment, the incident light from the outside can be allowed to leak out to the outside of the waveguide area and the light having the emitted wavelength can be confined within the waveguide area. Further, the semiconductor laser device to which the present invention is applied is not limited to those two structures, and the present invention is also applicable to a separated confinement Heterostructure (SCH) laser, or a semiconductor laser device having another structure. Specifically, so long as it is a semiconductor laser device having a structure in which an active layer for effecting radiative recombination of carriers is put between cladding layers having a lower refractive index than that of the active layer, the present invention can be applied thereto.

According to a third embodiment of the present invention, a semiconductor laser module is formed by using the semiconductor laser device according to the first or the second embodiment.

Figure 10:
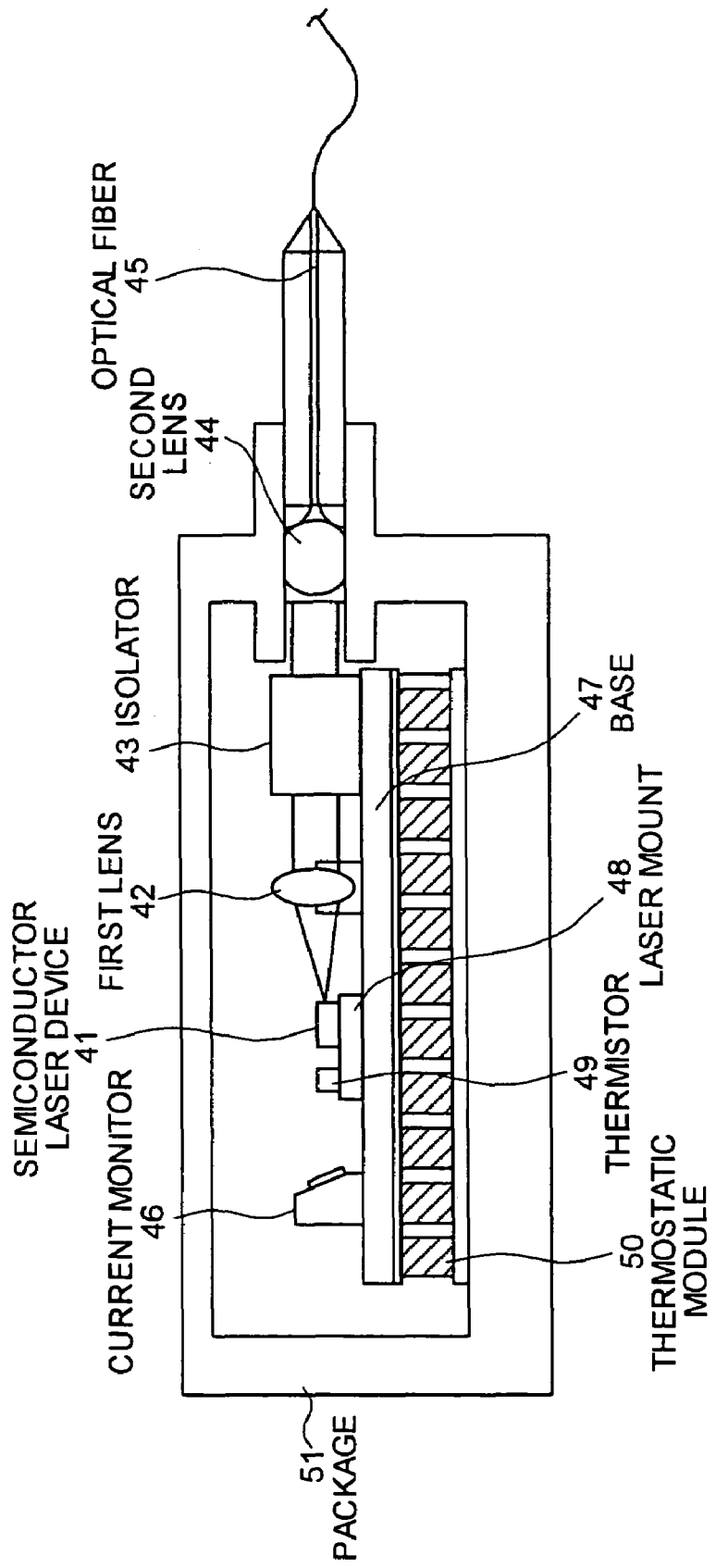
FIG. 10 is a side cross section of the structure of a semiconductor laser module according to a third embodiment of the present invention.

FIG. 10 is a side cross section of the structure of the semiconductor laser module according to the third embodiment. This semiconductor laser module has a semiconductor laser device 41 corresponding to the semiconductor laser device shown according to the first embodiment. This semiconductor laser device 41 has a junction down configuration in which the p-side electrode is joined onto a laser mount 48. As a housing for the semiconductor laser module, a thermostatic module 50 as a temperature controller is arranged on the inner bottom of the package 51 formed of a ceramic or the like. A base 47 is arranged on the thermostatic module 50, and the laser mount 48 is arranged on the base 47. An electric current (not shown) is provided to the thermostatic module 50, and cooling or heating is affected by the polarity thereof. However, to prevent a deviation in the emission wavelength due to a temperature rise of the semiconductor laser device 41, it mainly functions as a cooler. In other words, when the laser beams have a long wavelength as compared with a desired wavelength, the thermostatic module 50 cools the semiconductor laser device 41 to control the temperature thereof to a low temperature, and when the laser beams have a short wavelength as compared with the desired wavelength, the thermostatic module 50 heats the semiconductor laser device 41 to control the temperature thereof to a high temperature. This temperature control is performed based on a detection value of a thermistor 49 arranged close to the semiconductor laser device 41 on the laser mount 48, and a controller (not shown) generally controls the thermostatic module 50 so that the temperature of the laser mount 48 is generally kept to a constant value. The controller controls the thermostatic module 50 so that the temperature of the laser mount 48 drops with a rise in a driving current of the semiconductor laser device 41. By performing such temperature control, the output stability of the semiconductor laser device 41 can be improved, thereby effectively improving the yield. The laser mount 48 is preferably formed of a material having high thermal conductivity, for example, diamond. This is because when the laser mount 48 is formed of diamond, temperature rise at the time of applying high electric current can be suppressed.

The laser mount 48 on which the semiconductor laser device 41 and the thermistor 49 are arranged, a first lens 42, and a current monitor 48 are arranged on the base 47. The laser beams emitted from the semiconductor laser device 41 is wave-guided onto an optical fiber 45, via the first lens 42, an isolator 43, and a second lens 44. The second lens 44 is provided on the optical axis of the laser beams and on the package 51, and optically coupled with the externally connected optical fiber 45. The current monitor 46 monitors and detects light leaked from the high reflection coating side of the semiconductor laser device 41.

In the semiconductor laser module, the isolator 43 is put between the semiconductor laser device 41 and the optical fiber 45, so that reflected return light due to other optical parts does not return to the resonator.

When the semiconductor laser device 41 has the structure shown in FIGS. 1 and 2, a fiber grating is arranged inside the optical fiber 45, to form the resonator together with the light reflecting facet of the semiconductor laser device 41. In this case, it is necessary to have an in-line type structure wherein the isolator 43 is not arranged within the semiconductor laser module.

Advantages of the semiconductor laser module according to the third embodiment will be explained below. According to the third embodiment, the semiconductor laser device according to the first embodiment is used for the semiconductor laser device 41.

When light having a wavelength different from that of the emitted laser beams from the semiconductor laser device 41 is transmitted through the optical fiber 45, the light passes through the second lens 44 and the first lens 42, and enters into the semiconductor laser device 41. Since the incident light to the semiconductor laser device 41 diffuses, it can be suppressed that the light is reflected on the light reflecting facet of the semiconductor laser device 41 and is emitted again from the semiconductor laser device 41 to the optical fiber 45.

As explained in the first embodiment, the incident light from the outside leaks out to the n-type cladding layer from the waveguide area of the semiconductor laser device. Since the semiconductor laser device 41 is adhered on the laser mount 48 in the junction down configuration, the incident light from the outside leaks out upwards in the vertical direction. Therefore, the incident light from the outside is discharged to the upper part of the semiconductor laser device 41. When the light is discharged to the lower part thereof, there is the possibility that the light is reflected by the boundary between the laser mount 48 and the semiconductor laser device 41, and returns again to the semiconductor laser device 41. However, since the light is discharged upward, there is no such a problem. Further, since the light is discharged upward, such a problem is prevented that the discharged light enters into the current monitor 46 to cause a trouble in monitoring of the wavelength.

The semiconductor laser device according to the second embodiment may be used for the semiconductor laser device 41, in the laser module according to the third embodiment. Since the semiconductor laser device according to the second embodiment has the ridge structure, when it is fixed on the laser mount 48, it is desired to be fixed thereon with the n-side electrode coming in contact with the laser mount 48, not in the junction down structure.

Figure 11:
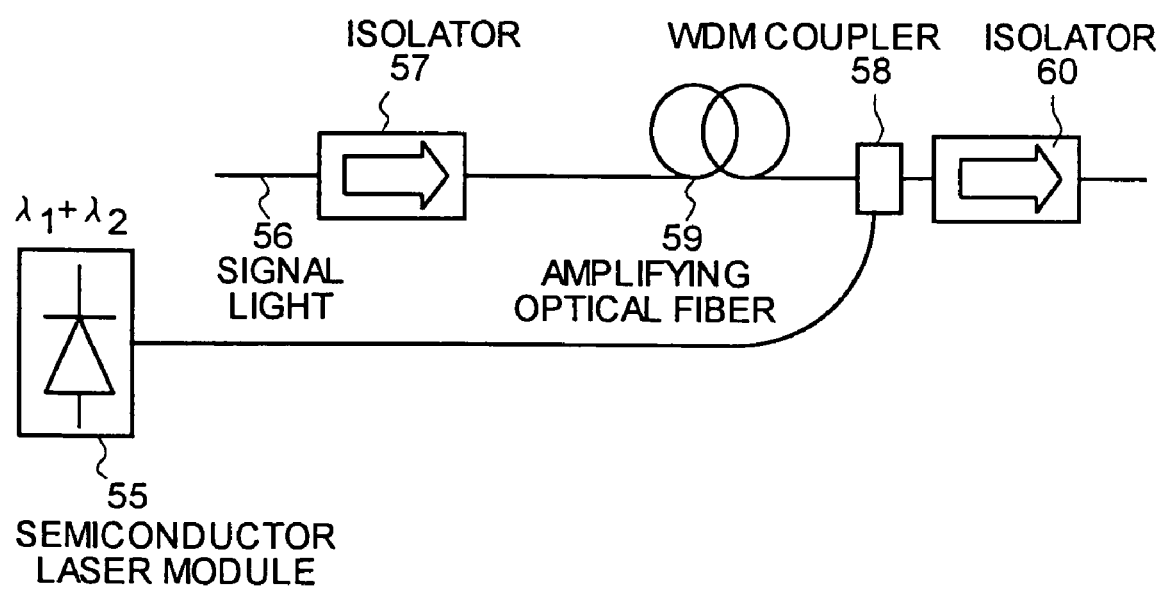
FIG. 11 is a diagram of the structure of an optical fiber amplifier according to a fourth embodiment of the present invention.
Figure 12A:
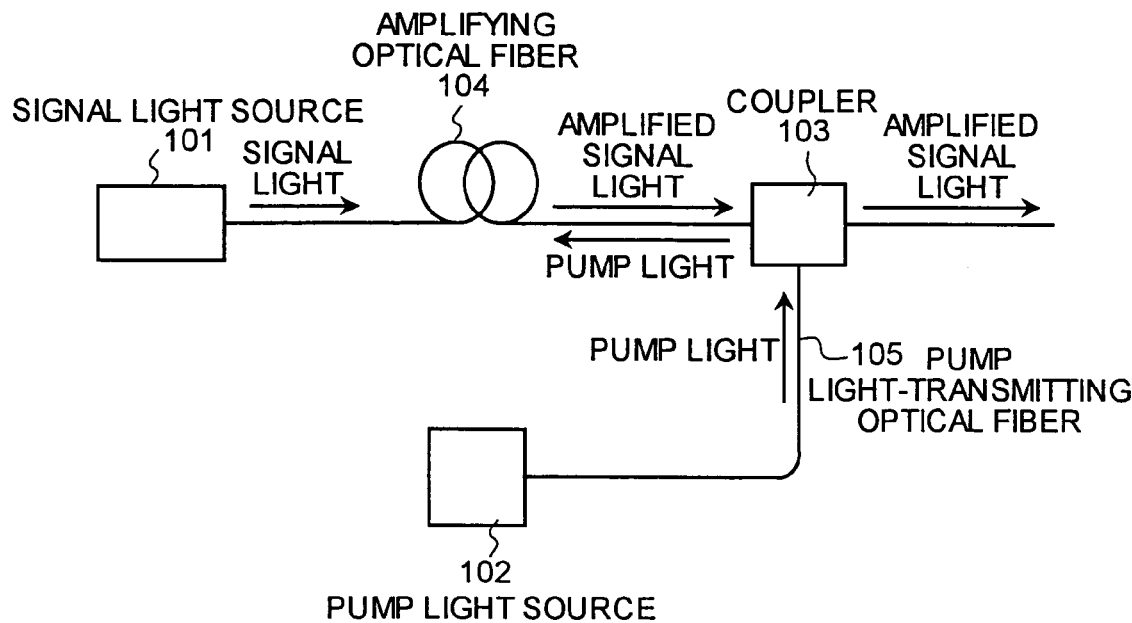
FIGS. 12A and 12B are diagrams of the structure of the optical fiber amplifier and a mode of light transmission according to a conventional technology.
Figure 12B:
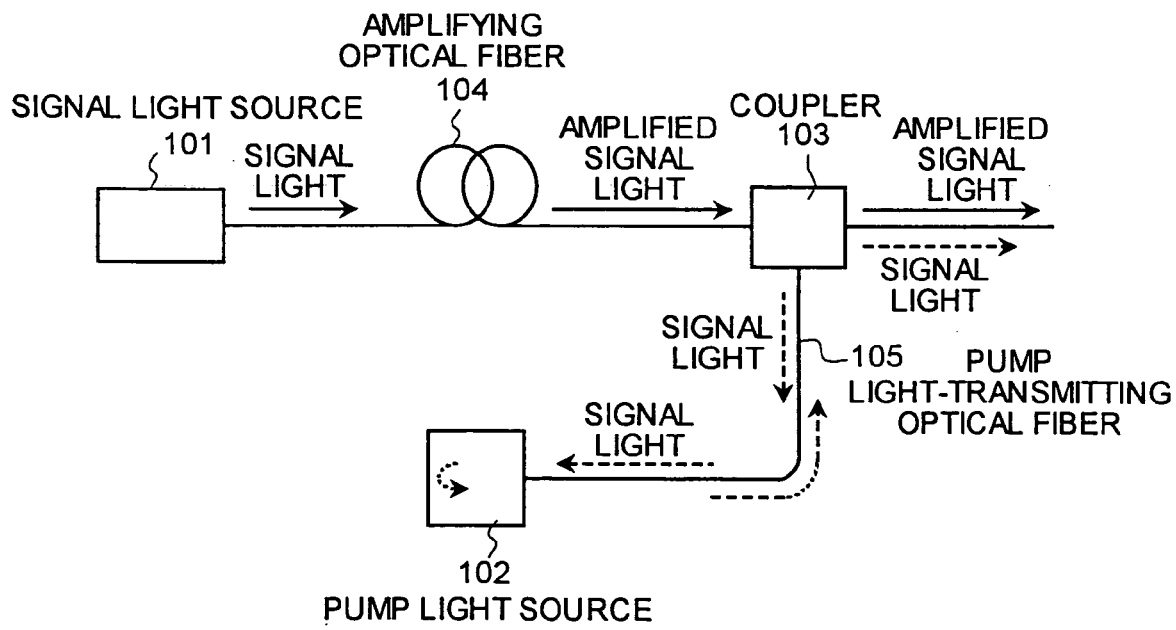

FIG. 11 is a diagram of the structure of the optical fiber amplifier according to a fourth embodiment of the present invention. This optical fiber amplifier has a semiconductor laser module 55 serving as a pump light source, an amplifying optical fiber 59 for amplifying signal light 56, and a WDM coupler 58 that allows pump light emitted from the semiconductor laser module 55 to enter into the amplifying optical fiber 59. An isolator 57 is arranged at a position before the signal light 56 enters into the WDM coupler 58, and an isolator 60 is arranged behind the amplifying optical fiber 59.

The signal light 56 is light emitted from a signal light source and transmitted through the optical fiber, and the wavelength thereof is assumed to be 1550 nanometers. The WDM coupler 58 outputs the pump light emitted from the semiconductor laser module 55 to the amplifying optical fiber 59. The isolator 57 serves to block the light reflected from the WDM coupler 58 and suppress noises and the like. The isolator 60 is for protecting the amplifying optical fiber 59 from the reflected light.

According to the fourth embodiment, an erbium-doped optical fiber (EDF) is used for the amplifying optical fiber 59. The EDF is obtained by doping erbium ions ($Er^{3+}$) on the optical fiber, and has a property such that it absorbs light having a wavelength of about 980 or 1480 nanometers to pump electrons in the erbium ions. The electrons amplify the signal light 56 having the wavelength of 1550 nanometers.

The semiconductor laser module according to the third embodiment is used for the semiconductor laser module 55. Therefore, the wavelength of 1550 nanometers light entering from the outside into the semiconductor laser module 55 diffuses within the semiconductor laser module 55. The 1550 nanometers light is not emitted again from the semiconductor laser module 55, or is emitted at a light intensity as small as it does not affect the signal light.

The optical amplification mechanism by the optical fiber amplifier according to the fourth embodiment will be explained roughly. The laser beams emitted from the semiconductor laser module 55, being the pump light source, pass through the WDM coupler 58, and enter into the amplifying optical fiber 59 from the front. Since the wavelength of the incident laser beams is 980 nanometers, the laser beams are absorbed by the doped erbium ions in the amplifying optical fiber 59, thereby pumping the electrons in the erbium ions.

The signal light 56 passes through the isolator 57, and enters into the amplifying optical fiber 59 from the back. Since the electrons in the erbium ions doped on the amplifying optical fiber 59 are pumped, the signal light 56 is amplified due to the energy of the pumped electrons.

A part of the amplified signal light 56 is separated by the WDM coupler 58, and enters into the semiconductor laser module 55. However, the semiconductor laser device installed in the semiconductor laser module 55 has a structure such that it does not confine the 1550 nanometers light within the waveguide area, but allows the light to leak out to the n-type cladding layer and be discharged to the substrate. Therefore, most of the incident light to the semiconductor laser module 55 does not reach the light reflecting facet, and even if the light reaches the light reflecting facet and is reflected therefrom, the light mostly leaks out to the n-type cladding layer, and is not emitted again. On the other hand, the light having the wavelength of 980 nanometers, being the emitted wavelength, is confined within the waveguide area, and hence the function thereof as the output light source of the pump light is not damaged.

Therefore, the optical fiber amplifier according to the fourth embodiment can effectively reduce the noise components having the same wavelength as that of the signal light. Accordingly, the original signal light is not coupled with the noise components having a phase difference from that of the original signal light due to having passed through the semiconductor laser module 55, thereby causing no problem in transmission of information.

According to the fourth embodiment, a so-called forward pumping method in which the pump light is pumped from the front of the amplifying optical fiber 59 is employed, but the present invention is not limited thereto. For example, the present invention is applicable to an optical fiber amplifier using a so-called backward pumping method in which a signal light before being amplified is coupled with the pump light beforehand and is allowed to enter into the amplifying optical fiber 59. It is because even in the case of the backward pumping method, since a part of the signal light enters into the semiconductor laser module constituting the pump light source, it is necessary to prevent the part of the signal light from being reflected and emitted again from the pump light source.

According to the fourth embodiment, the signal light is amplified by using the EDFA, but the present invention is also applicable to an optical fiber amplifier employing a pump method other than the EDFA. For example, by applying the present invention to a Raman amplifier, the semiconductor laser device included in the pump light source has a structure of diffusing the signal light, thereby enabling suppression of the noise components. When the present invention is applied to the Raman amplifier, it is necessary to determine the emitted wavelength of the semiconductor laser device included in the pump light source, taking the wavelength shift into consideration.

According to the fourth embodiment, the semiconductor laser module according to the third embodiment is used for the pump light source, it may be applied to a signal light source. Generally, in the optical communications, a semiconductor laser module in which a semiconductor laser device is incorporated as in the pump light source is used as the signal light source. Therefore, it is necessary to prevent the incident light from the outside from being reflected on the light reflecting facet of the semiconductor laser device and entering again into the optical fiber.

As explained above, according to the present invention, with respect to the first wavelength, being the emitted wavelength, the refractive indexes of the first conductive cladding layer and the second conductive cladding layer are lower than the effective refractive index, and hence, there is the effect that the first wavelength light can be confined between the first conductive cladding layer and the second conductive cladding layer. On the other hand, with respect to the second wavelength light entering from the outside, the refractive index of at least one of the first and the second conductive cladding layers has a value larger than the effective refractive index, and hence, the incident light from the outside is not confined, and the light is allowed to leak out to the cladding layer having a high refractive index.

Furthermore, according to the present invention, the refractive index of the cladding layer having a high density of impurities with respect to the second wavelength is made higher than the effective refractive index. As one means, the refractive index of the cladding layer can be made higher than the effective refractive index by laminating a thick layer of a material having a high refractive index to form the cladding layer. In this case, by selecting a cladding layer doped with impurities in a larger amount, an increase in the heat resistance and the electrical resistance due to an increase in the layer thickness can be suppressed.

Moreover, according to the present invention, the refractive index of the first conductive cladding layer with respect to the second wavelength is increased. When the semiconductor laser device is fixed on the laser mount in the junction down configuration, if the structure thereof is such that the refractive index of the first conductive cladding layer is made higher than the effective refractive index, so that the layer thickness of the active layer and the second conductive cladding layer is not increased, a semiconductor laser device that does not negatively affect the conduction of heat generated from the active layer can be provided.

Furthermore, according to the present invention, since the difference between the first wavelength and the second wavelength is equal to or more than 200 nanometers, the first wavelength light can be easily confined, and the second wavelength light can be allowed to leak out.

Moreover, according to the present invention, since the first wavelength is set to from 950 to 1100 nanometers inclusive, and the second wavelength is set to from 1500 to 1600 nanometers inclusive, when the second wavelength light is used as the signal light, and the first wavelength light is used as the pump light, a semiconductor laser device in which even if the signal light enters from the outside, the light can be allowed to leak out therein can be provided.

Furthermore, according to the present invention, since the first wavelength is 980 nanometers, and the second wavelength is 1550 nanometers, a semiconductor laser device that can be applied to the pump light source in the optical communications can be provided.

Moreover, according to the present invention, since the first conductive waveguide and the second conductive waveguide are provided, the emitted laser beams are confined in the active layer and the waveguide, and hence, a wide waveguide area as compared with an instance in which the light propagates only in the active layer, is provided. Further, since the optical output density can be decreased, a semiconductor laser device having durability against optical damages can be provided.

Furthermore, according to the present invention, since the active layer includes the quantum well layer, the carriers can be efficiently confined within the quantum well layer due to the quantum confinement effect, thereby improving the luminous efficiency.

Moreover, according to the present invention, since a plurality of quantum well layers separated from each other is included, carriers can be confined due to the quantum confinement effect by the quantum well layers, thereby improving the temperature characteristics.

Furthermore, according to the present invention, since the second conductive cladding layer has a narrow width, the density of the injected current can be improved, and hence, a semiconductor laser device having high luminous efficiency can be provided.

Moreover, according to the present invention, since the first and the second conductive carrier block layers are provided, the injected carriers can be confined near the active layer to suppress the carrier overflow, and the layer thickness of the waveguide can be increased. As a result, there is the effect that high output can be realized, while maintaining the temperature characteristics.

Furthermore, according to the present invention, since the second wavelength light transmitted through the optical fiber is diffused inside the semiconductor laser device, a semiconductor laser module that does not emit the second wavelength light again can be provided.

Moreover, according to the present invention, since the optical detector is provided, the intensity of the emitted laser beams can be stabilized. Since the isolator is also provided, the laser beams emitted from the semiconductor laser device can be prevented from returning again to the semiconductor laser device.

Furthermore, according to the present invention, even if a part of the second wavelength signal light enters into the pump light source via a coupler, the light is diffused inside of the semiconductor laser device provided in the pump light source or of the semiconductor laser module, thereby preventing the light from returning again to the optical fiber. As a result, there is the effect that generation of noise components having the same wavelength as that of the signal light can be suppressed.

Moreover, according to the present invention, since the amplifying optical fiber is doped with erbium, an optical amplifier by the EDFA can be provided.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device comprising:
   a layer structure of a first conductive cladding layer, an active layer, and a second conductive cladding layer sequentially grown on a first conductive semiconductor substrate; and
   a light emitting facet from which a laser beam having a first wavelength is emitted, wherein
   refractive indexes of the first conductive cladding layer and the second conductive cladding layer with respect to the first wavelength are lower than an effective refractive index with respect to the first wavelength, and
   with respect to a light having a second wavelength incident on the light emitting facet from outside, the refractive index of at least one of the first conductive cladding layer and the second conductive cladding layer is equal to or higher than the effective refractive index with respect to the second wavelength.

2. The semiconductor laser device according to claim 1, wherein the refractive index of a cladding layer having a higher density of an impurity, from among the first and the second conductive cladding layers, is equal to or higher than the effective refractive index with respect to the second wavelength.

3. The semiconductor laser device according to claim 1, wherein the refractive index of the first conductive cladding layer is equal to or higher than the effective refractive index with respect to the second wavelength.

4. The semiconductor laser device according to claim 1, wherein a difference between the first wavelength and the second wavelength is equal to or more than 200 nanometers.

5. The semiconductor laser device according to claim 1, wherein
   the first wavelength is in a range between 950 nanometers and 1100 nanometers, and
   the second wavelength is in a range between 1500 nanometers to 1600 nanometers.

6. The semiconductor laser device according to claim 1, wherein
   the first wavelength is 980 nanometers, and
   the second wavelength is 1550 nanometers.

7. The semiconductor laser device according to claim 1, further comprising:
   a first waveguide layer arranged between the first conductive cladding layer and the active layer; and
   a second waveguide layer arranged between the active layer and the second conductive cladding layer.

8. The semiconductor laser device according to claim 1, wherein the active layer includes a quantum well layer.

9. The semiconductor laser device according to claim 1, wherein the active layer includes
   a plurality of quantum well layers; and
   a barrier layer arranged between the quantum well layers.

10. The semiconductor laser device according to claim 1, wherein a width of the second conductive cladding layer in a direction perpendicular to a direction of emission of the laser beam is narrower than a width of the first conductive substrate.

11. The semiconductor laser device according to claim 1, further comprising:
    a first conductive carrier-blocking-layer arranged between the first waveguide layer and the active layer; and
    a second conductive carrier-blocking-layer arranged between the active layer and the second waveguide layer.

12. A semiconductor laser device comprising:
    a layer structure of a first conductive cladding layer, an active layer, and a second conductive cladding layer sequentially grown on a first conductive semiconductor substrate; and
    a light emitting facet from which a laser beam having a first wavelength is emitted, wherein
    refractive indexes of the first conductive cladding layer and the second conductive cladding layer with respect to the first wavelength are lower than an effective refractive index with respect to the first wavelength, and
    with respect to a light having a second wavelength incident on the light emitting facet from outside, the effective refractive index is equal to or lower than 1.003 times of the refractive index of at least one of the first conductive cladding layer and the second conductive cladding layer.

13. The semiconductor laser device according to claim 12, wherein a difference between the first wavelength and the second wavelength is equal to or more than 200 nanometers.

14. The semiconductor laser device according to claim 12, wherein
the first wavelength is in a range between 950 nanometers and 1100 nanometers, and
the second wavelength is in a range between 1500 nanometers to 1600 nanometers.

15. The semiconductor laser device according to claim 12, wherein
the first wavelength is 980 nanometers, and
the second wavelength is 1550 nanometers.

16. The semiconductor laser device according to claim 12, further comprising:
a first waveguide layer arranged between the first conductive cladding layer and the active layer; and
a second waveguide layer arranged between the active layer and the second conductive cladding layer.

17. The semiconductor laser device according to claim 12, wherein the active layer includes a quantum well layer.

18. The semiconductor laser device according to claim 12, wherein the active layer includes
a plurality of quantum well layers; and
a barrier layer arranged between the quantum well layers.

19. The semiconductor laser device according to claim 12, wherein a width of the second conductive cladding layer in a direction perpendicular to a direction of emission of the laser beam is narrower than a width of the first conductive substrate.

20. The semiconductor laser device according to claim 12, further comprising:
a first conductive carrier-blocking-layer arranged between the first waveguide layer and the active layer; and
a second conductive carrier-blocking-layer arranged between the active layer and the second waveguide layer.

21. A semiconductor laser module comprising:
a semiconductor laser device that includes
a layer structure of a first conductive cladding layer, an active layer, and a second conductive cladding layer sequentially grown on a first conductive semiconductor substrate; and
a light emitting facet from which a laser beam having a first wavelength is emitted;
an optical fiber that guides the laser beam emitted from the semiconductor laser device to outside; and
an optical coupling lens system that optically couples the semiconductor laser device and the optical fiber, wherein refractive indexes of the first conductive cladding layer and the second conductive cladding layer with respect to the first wavelength are lower than an effective refractive index with respect to the first wavelength, and
with respect to a light having a second wavelength incident on the light emitting facet from the outside, the refractive index of at least one of the first conductive cladding layer and the second conductive cladding layer is equal to or higher than the effective refractive index with respect to the second wavelength.

22. The semiconductor laser module according to claim 21, further comprising:
an optical detector that measures optical output of the semiconductor laser device;
a temperature control module that controls temperature of the semiconductor laser device; and
an isolator.

23. A semiconductor laser module comprising:
a semiconductor laser device that includes
a layer structure of a first conductive cladding layer, an active layer, and a second conductive cladding layer sequentially grown on a first conductive semiconductor substrate; and
a light emitting facet from which a laser beam having a first wavelength is emitted;
an optical fiber that guides the laser beam emitted from the semiconductor laser device to outside; and
an optical coupling lens system that optically couples the semiconductor laser device and the optical fiber, wherein
refractive indexes of the first conductive cladding layer and the second conductive cladding layer with respect to the first wavelength are lower than an effective refractive index with respect to the first wavelength, and
with respect to a light having a second wavelength incident on the light emitting facet from the outside, the effective refractive index is equal to or lower than 1.003 times of the refractive index of at least one of the first conductive cladding layer and the second conductive cladding layer.

24. The semiconductor laser module according to claim 23, further comprising:
an optical detector that measures optical output of the semiconductor laser device;
a temperature control module that controls temperature of the semiconductor laser device; and
an isolator.

25. An optical fiber amplifier comprising:
a pump light source that includes a semiconductor laser device that includes
a layer structure of a first conductive cladding layer, an active layer, and a second conductive cladding layer sequentially grown on a first conductive semiconductor substrate; and
a light emitting facet from which a laser beam having a first wavelength is emitted;
an optical fiber that transmits a signal light having the second wavelength;
an amplifying optical fiber connected to the optical fiber; and
a coupler that allows the pump light having the first wavelength emitted from the pump light source to enter into the amplifying optical fiber, wherein
refractive indexes of the first conductive cladding layer and the second conductive cladding layer with respect to the first wavelength are lower than an effective refractive index with respect to the first wavelength, and
with respect to a light having a second wavelength incident on the light emitting facet from outside, the refractive index of at least one of the first conductive cladding layer and the second conductive cladding layer is equal to or higher than the effective refractive index with respect to the second wavelength.

26. The optical fiber amplifier according to claim 25, wherein the amplifying optical fiber is an erbium-doped fiber.

27. An optical fiber amplifier comprising:
a pump light source that includes a semiconductor laser device that includes a layer structure of a first conductive cladding layer, an active layer, and a second conductive cladding layer sequentially grown on a first conductive semiconductor substrate; and a light emitting facet from which a laser beam having a first wavelength is emitted;

an optical fiber that transmits a signal light having the second wavelength;

an amplifying optical fiber connected to the optical fiber; and a coupler that allows the pump light having the first wavelength emitted from the pump light source to enter into the amplifying optical fiber, wherein refractive indexes of the first conductive cladding layer and the second conductive cladding layer with respect to the first wavelength are lower than an effective refractive index with respect to the first wavelength, and with respect to a light having a second wavelength incident on the light emitting facet from outside, the effective refractive index is equal to or lower than 1.003 times of the refractive index of at least one of the first conductive cladding layer and the second conductive cladding layer.

28. The optical fiber amplifier according to claim 27, wherein the amplifying optical fiber is an erbium-doped fiber.

29. An optical fiber amplifier comprising:

a pump light source that includes a semiconductor laser module including a semiconductor laser device that includes a layer structure of a first conductive cladding layer, an active layer, and a second conductive cladding layer sequentially grown on a first conductive semiconductor substrate; and a light emitting facet from which a laser beam having a first wavelength is emitted;

an optical fiber that guides the laser beam emitted from the semiconductor laser device to outside; and an optical coupling lens system that optically couples the semiconductor laser device and the optical fiber;

an optical fiber that transmits a signal light having the second wavelength;

an amplifying optical fiber connected to the optical fiber; and a coupler that allows the pump light having the first wavelength emitted from the pump light source to enter into the amplifying optical fiber, wherein refractive indexes of the first conductive cladding layer and the second conductive cladding layer with respect to the first wavelength are lower than an effective refractive index with respect to the first wavelength, and with respect to a light having a second wavelength incident on the light emitting facet from the outside, the effective refractive index is equal to or lower than 1.003 times of the refractive index of at least one of the first conductive cladding layer and the second conductive cladding layer.

30. The optical fiber amplifier according to claim 29, wherein the amplifying optical fiber is an erbium-doped fiber.

31. An optical fiber amplifier comprising:

a pump light source that includes a semiconductor laser module including a semiconductor laser device that includes a layer structure of a first conductive cladding layer, an active layer, and a second conductive cladding layer sequentially grown on a first conductive semiconductor substrate; and a light emitting facet from which a laser beam having a first wavelength is emitted;

an optical fiber that guides the laser beam emitted from the semiconductor laser device to outside; and an optical coupling lens system that optically couples the semiconductor laser device and the optical fiber;

an optical fiber that transmits a signal light having the second wavelength;

an amplifying optical fiber connected to the optical fiber; and a coupler that allows the pump light having the first wavelength emitted from the pump light source to enter into the amplifying optical fiber, wherein refractive indexes of the first conductive cladding layer and the second conductive cladding layer with respect to the first wavelength are lower than an effective refractive index with respect to the first wavelength, and with respect to a light having a second wavelength incident on the light emitting facet from the outside, the effective refractive index is equal to or lower than 1.003 times of the refractive index of at least one of the first conductive cladding layer and the second conductive cladding layer.

32. The optical fiber amplifier according to claim 31, wherein the amplifying optical fiber is an erbium-doped fiber.

* * * * *